United States Patent [19]
Zachman et al.

[11] Patent Number: 5,308,645
[45] Date of Patent: May 3, 1994

[54] METHOD AND APPARATUS FOR THROUGH HOLE SUBSTRATE PRINTING

[75] Inventors: Joseph M. Zachman; Donald E. Eagle, both of Greentown; Sherri L. Bernhard, Noblesville; Michael G. Coady; Jeffery P. Somers, both of Kokomo, all of Ind.

[73] Assignee: Delco Electronics Corporation, Kokomo, Ind.

[21] Appl. No.: 925,839

[22] Filed: Aug. 7, 1992

[51] Int. Cl.⁵ .............................................. B05D 5/12
[52] U.S. Cl. .................................. 427/97; 118/500; 118/50; 427/294; 101/126
[58] Field of Search ................... 427/97, 294; 118/50, 118/500, 704, 706; 101/114, 126, 129

[56] References Cited

U.S. PATENT DOCUMENTS

| | | | |
|---|---|---|---|
| 3,993,018 | 11/1976 | Kranik et al. | 118/52 |
| 4,040,352 | 8/1977 | Curti | 118/502 |
| 4,971,676 | 11/1990 | Doue et al. | 118/503 |
| 5,080,929 | 1/1992 | Zachman et al. | 427/97 |

FOREIGN PATENT DOCUMENTS

| | | | |
|---|---|---|---|
| 0111320 | 7/1983 | Japan | 118/52 |
| 0132930 | 8/1983 | Japan | 118/52 |
| 423900 | 2/1935 | United Kingdom | 118/52 |

*Primary Examiner*—Peter Chin
*Assistant Examiner*—Brenda Lamb
*Attorney, Agent, or Firm*—Cary W. Brooks; Mark A. Navarre

[57] ABSTRACT

Disclosed is an apparatus and method of through hole substrate printing wherein the apparatus includes a nest plate having a plurality of vacuum source holes formed therein of a size substantially greater than the through holes in the substrate, and a plurality of removable pointed pins supporting the substrate in a substantially flat and horizontal position during the printing operation. The removably pointed pins allow for the flexibility of printing a variety of conductive patterns for different substrates and without the risk of breaking the substrate or smearing the conductive pattern on the bottom surface of the substrate or the subsequent substrate to be printed.

16 Claims, 2 Drawing Sheets

METHOD AND APPARATUS FOR THROUGH HOLE SUBSTRATE PRINTING

FIELD OF THE INVENTION

This invention relates to the manufacture of substrates including electrical circuit paths on the upper and lower surfaces thereof and through holes extending therebetween and particularly to the application of conductive material to the inner surfaces of the through holes to provide an electrical connection between circuit paths on the upper and lower surfaces of the substrate.

BACKGROUND OF THE INVENTION

The application of conductive material to inner surfaces of through holes, referred to as through hole printing, has been performed using manual printing systems. An operator hand loads a substrate onto a support referred to in the art as a printing nest. The operator locates the substrate on the printing nest so that the through holes on the substrate are aligned with corresponding holes in the printing nest. Holes in the printing nest being approximately the same diameter as the holes in the substrate. The operator then activates a hold-down vacuum, which is applied through holes in the printing nest located adjacent to the perimeter of the substrate, to clamp the substrate to the nest.

The print nest is thereafter moved into a printing position under a printing screen. The printing operation is then performed whereby the desired pattern of conductive paths, including the conductive material for the through holes, is printed on the substrate and the nest is moved back to the load/unload position. The operator then activates a second vacuum that is applied to the corresponding holes in the nest and serves to pull the conductive material through the holes in the substrate and coat the inner walls of the through holes. U.S. Pat. No. 4,710,395 issued to Young et al on Dec. 1, 1987, discloses a method and apparatus that can be used to increase the uniformity of this coating operation. This completes the printing operation, and the operator deactivates both vacuums and removes the substrate from the printing nest. Before loading the next substrate, the operator must wipe away excess conductive material that has been pulled through the through holes of the previous substrate onto the surface of the nest. Otherwise, this excess conductive material on the surface of the nest will smear onto the bottom surface of the next substrate and cause electrical shorts between conductive paths on the lower surface.

U.S. Pat. No. 5,080,921 issued to Zachman et al on Jan. 14, 1992, and assigned to the assignee of the present invention, discloses a method of avoiding the smearing problem associated the above-described manual through hole substrate printing operation. The apparatus of that invention includes a means for supporting an edge portion of the substrate and a means for interacting with the bottom surface of an interior portion of the substrate, the interacting means being located along side the support means. The interacting means, which in terms of the art could be considered to be an inner nest, includes holes of the same diameter as the holes in the substrate and positioned to directly align with the substrate holes. The apparatus further includes a means for reciprocably moving the interacting means generally perpendicular to the substrate between a position in which the interacting means is spaced from the bottom surface of the substrate and a position in which the interacting means is in a juxtaposition with the bottom surface of the substrate. The apparatus also includes a means for applying conductive material to the top surface of the substrate and a means for applying a vacuum to the holes in the interacting means to pull the conductive material through the through holes in the substrate, whereby printing occurs. The moving means junction to move the interacting means into juxtaposition with the bottom surface of the substrate when the conductive material is applied to the top surface of the substrate, and moves the interacting means to its position spaced away from the substrate after the conductive material has been applied and pulled through the substrate by the vacuum means. Thus, the substrate is in a stationary position when the printing nest is moved into juxtaposition with respect to the bottom surface of the substrate, and no sliding of the substrate with respect to the printing nest occurs. Thus, that apparatus avoids the problem of smearing of the conductive material described in the manual operation as set forth above.

The shortcomings of that apparatus include the lack of flexibility to print various conductive patterns with a single printing nest. The vacuum holes in the printing nest of that apparatus must align with the through holes in the substrate. Thus, substrates having through holes in different locations than the through holes in nest could not be printed on the same printing nest.

The present invention provides an alternative apparatus and method of through hole printing which avoids the smearing problem and avoids the need for complicated apparatus having a means for moving interacting printing nest from a position juxtaposed to the substrate into a position spaced away from the substrate.

SUMMARY OF THE INVENTION

Generally, an apparatus according to the present invention includes a deep vacuum chamber, and a printing nest having a plurality of substantially large vacuum source holes and a plurality of pointed pins. The nest vacuum holes are much larger than the holes in the substrate to be printed and the nest vacuum holes are not necessarily aligned directly with the substrate holes. The nest is designed such that there is a minimum surface area on each pointed pin in contact with the bottom of the substrate. In a preferred embodiment the pins are removable. Thus, when a pin interferes with a through hole in the substrate, the pin may be simply removed and the remaining pins support the substrate. Alternatively, the pins can be moved out of contact with the substrate so as to avoid blocking substrate through holes. The ability to selectively move or remove the pointed pins creates a level of flexibility that allows for any through hole pattern to be printed with a single nest plate.

DETAILED DESCRIPTION OF THE INVENTION

Figure 1:
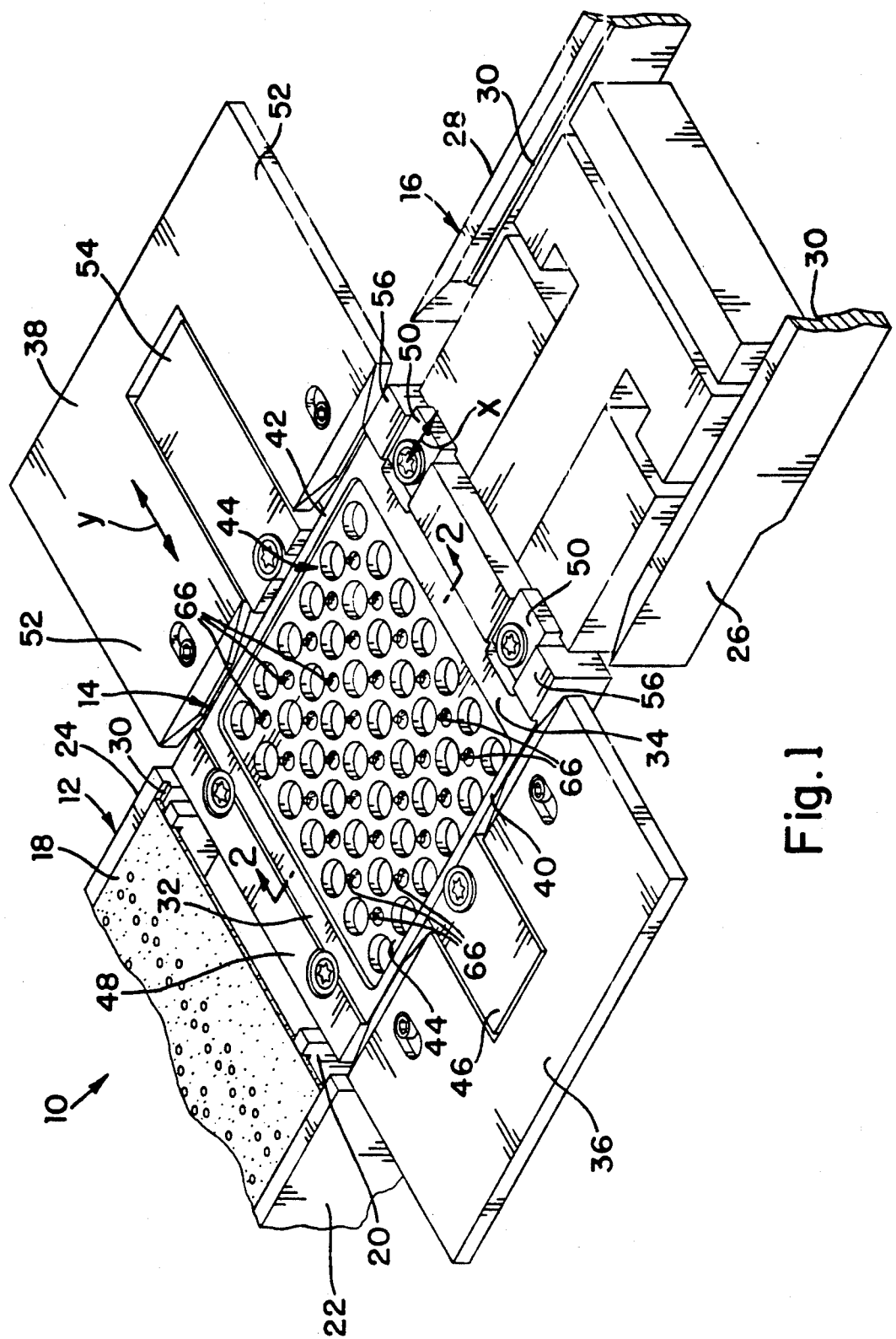
FIG. 1 is a top perspective view of an apparatus according to the present invention.

FIG. 1 shows an apparatus 10 according to the present invention. The apparatus includes a pre-print station 12, a print station 14 and post-print station 16. All three stations accommodate a planar substrate 18 that is formed from an electrically non-conductive material such as a ceramic. The substrate includes opposed top and bottom surfaces and an array of through holes extending between these surfaces.

The substrate is located in the pre-print station prior to the printing operation, and the print station during the printing operation, and in the post-print station after the printing operation. A means such as a walking beam 20 periodically advances the substrate from one station to the next. The timing of the advance corresponds to the time it takes to complete the hereafter described cycle of the printing operation.

The pre-print station and the post-print station each include pairs of guide rails 22, 24, 26, 28. Face surfaces of each pair of guide rails are spaced from one another slightly greater than the width of the substrate. In addition, the facing surfaces of each pair of guide rails include ledges 30 for accommodating opposite side portions of the substrate. The ledges serve to support the substrate in the suspended position.

The print station includes a means for supporting the substrate in the suspended position. The means for supporting the substrate may include a pair of support members 32, 34 that extend between a pair of spaced guide blocks 36, 38 and/or a pair of support member 40, 42 that extend between the pre-print and post-print stations. Alternatively, the means for supporting may be a single ledge surrounding the nest plate 44. The support members or the single ledge are of a width such that they engage just the edge portion of the substrate.

The print station also includes a means for locating the substrate in a particular position. The locating means may include stationary locators 46, 48 and movable locators 50, 52. Movable locators 52 is located opposite stationary locator 46. The movable locators 52 move with respect to a guide block 54 in the direction of arrow y in FIG. 1. Movable locator 50 moves with respect to guide block 56 in the direction of arrow x in FIG. 1.

Figure 2:
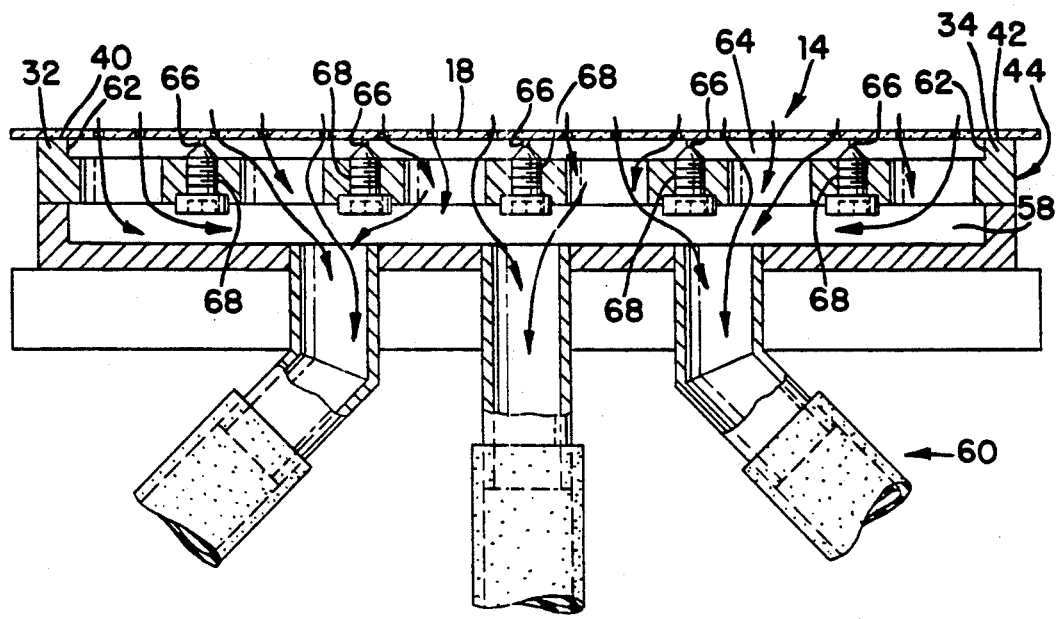
FIG. 2 is a sectional view taken along line 2—2 of FIG. 1.
Figure 3:
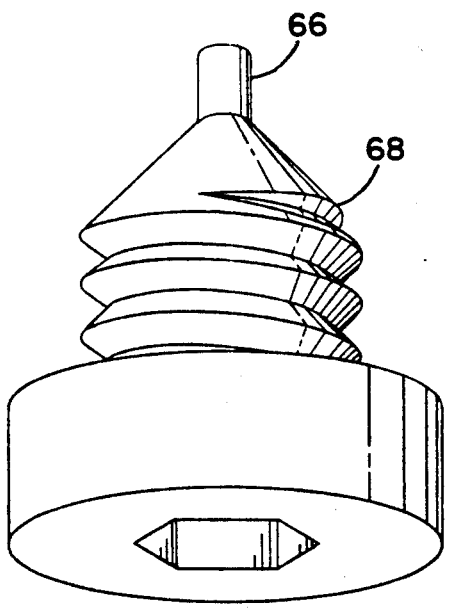
FIG. 3 is an enlarged view of a pin according to the present invention.

As shown in FIG. 2, the print station includes a nest station overlying a first deep vacuum chamber 58 and a means for drawing the vacuum 60 communicating with the deep drawing vacuum and the nest plate 44. The nest station includes a substantially flat nest plate and wall 62 extend upwardly from the nest plate to define a second nest vacuum chamber 64. The upwardly extending walls may be of a height ranging from about 0.080" to about 0.120". However, as long as the pins are long enough to reach the bottom of the substrate, the chamber could be at any reasonable depth. The nest plate includes a plurality of pointed pins 66 for supporting the substrate 18. In a preferred embodiment (shown in FIG. 3), the pointed pins include a base portion 68 which is threaded around its circumference to be removably threaded in a threaded hole in the nest plate 44. Preferably, the nest is designed such that there is a minimal surface area on each pin in contact with the bottom of the substrate. For example, the surface area of the pointed pin contacting the substrate may range from about 0.015" to about 0.045". However, the size of the pin may vary with manufacturing tolerances. If a substrate is being printed such that a pin interferes with the through hole of the substrate, the pin may be simply lowered or removed. The pointed pin may be turned such that the threads cause the tip of the pin to move away from the substrate. The ability to selectively remove the pin creates a level of flexibility that allows any through hole pattern to be printed with a single nest plate. The nest plate also includes a plurality of vacuum source holes. In a preferred construction, the printed station includes a 3"×5"×0.1" deep vacuum chamber, and a nest plate having sixty ⅛" vacuum source holes and 54 threaded holes having threadably received therein 54 pointed pins. The nest plate may include alternating rows of pointed pins and vacuum source holes.

A suitable means for creating a vacuum is disclosed in U.S. Pat. No. 4,710,395 issued to Young et al, the disclosure of which is hereby incorporated by reference.

The pins are located on the printing nest so as to support the substrate during the vacuum draw process. If the substrate is not supported in a substantially horizontally position, the force of the vacuum draw may crack or break the substrate. Further, holding the substrate in a substantially horizontal position is necessary to print the conductive patterns with uniform thicknesses. Should the substrate bow, the thickness of the conductive pattern will vary across the surface of the substrate. Conductor patterns of uniform thickness are important in order to provide good wire bonds to such patterns. This is because an intermetallic layer is formed between the conductor and the wire metal during the wire bonding process. A portion of the conductor material is consumed by this intermetallic layer. If the conductor is too thin, all will be consumed leaving nothing to adhere to the substrate. The bond will eventually fail due to the lack of adhesion of the conductor to the substrate.

The embodiments of the invention in which an exclusive property or privilege is claimed are defined as follows:

1. A combination comprising a non-conductive substrate and an apparatus for applying conductive material to the non-conductive substrate having first and second opposed surfaces, perimeter portions, and an interior portion having through holes extending between the first and second surfaces, and wherein the apparatus comprising:
a support for supporting a first perimeter portion of the substrate;
a printing nest plate having plurality of pointed pins constructed and arranged to support said substrate in a substantially flat and horizontal position during printing on the substrate; an applicator for applying conductive material to the substrate; and a vacuum device for drawing a vacuum through said substrate through holes.

2. A combination as set forth in claim 1 wherein said printing plate has a threaded hole formed therein for each pointed pin and said pointed pin comprises a threaded portion constructed and arranged to selectively remove said pointed pin from a position for contacting said substrate.

3. A combination as set forth in claim 1 further comprising walls extending upwardly from said printing nest plate so that said walls and nest plate define a vacuum chamber in operable communication with the vacuum device.

4. A combination as set forth in claim 3 wherein said nest plate has vacuum source holes formed therein of a size substantially larger than said substrate through holes, and said vacuum device communicating with said nest plate through holes.

5. A combination as set forth in claim 4 wherein at least one of said vacuum source holes is threaded, and further comprising a vacuum source plug threaded so as to be removably received in the threaded vacuum source hole.

6. A combination as set forth in claim 1 further comprising a pre-print station and a post-print station on opposite sides of said printing nest plate and an advancing device for moving a substrate from said pre-print station to said printing nest plate, and to said post-printing station.

7. A combination as set forth in claim 6 wherein said advancing device comprises a walking beam.

8. A combination comprising:
a printing nest plate for printing a portion of an electric circuit on a substrate, the nest plate having a plurality of pointed pins arranged to support, in a substantially flat and horizontal position, a substrate having through holes formed therein for printing, and further comprising vacuum source holes formed in said plate having a size substantially larger than the through holes in said substrate.

9. A combination as set forth in claim 8 further comprising a means for drawing a vacuum through said through holes in said substrate.

10. A combination as set forth in claim 8 further comprising walls extending upwardly from said nest plate so that said nest plate and said walls define a nest vacuum chamber.

11. A combination as set forth in claim 10 wherein said walls have a height ranging from about 0.080" to about 0.120".

12. A combination as set forth in claim 8 wherein said pointed pins are threadedly removable.

13. A method of printing conductive ink on a first and second substrate having different through hole designs from each other comprising:
providing a printing nest station having a plurality of pointed pins for supporting said first substrate in a substantially flat and horizontal position during a printing operation and so that none of said pointed pins block a through hole in said first substrate;
placing said first substrate on said pointed pins;
printing conductive ink on said substrate;
applying a vacuum to said printing nest so that ink is drawn through said first substrate through holes and so that no ink contacts the surfaces of said printing station that supports said substrate;
removing said vacuum and said substrate;
said second substrate having a through hole design such that at least one of the through holes in the second substrate is blocked by a pointed pin if properly placed on said printing station to be printed;
moving any pointed pins blocking a through hole of said second substrate to a position so that when said second substrate is placed on said printing station none of the through holes are blocked by a pointed pin;
applying ink to said second substrate;
applying a vacuum to said printing nest station so that ink is drawn through the through holes in said second substrate and so that ink does not contact any of the surfaces supporting said second substrate; and
removing said vacuum and second substrate.

14. A method as set forth in claim 13 wherein said printing nest station further comprises a nest plate carrying said pointed pins and walls extending upwardly from said nest plate to define a nest vacuum chamber, and vacuum source holes formed in said nest plate having a size substantially greater than the through holes in said substrate, and a vacuum device for applying a vacuum communicating with said printing nest station, and further comprising the step of plugging a vacuum source hole in said nest plate which is not necessary to draw a vacuum through said substrate.

15. An apparatus for applying conductive ink to a substrate having first and second opposed surfaces, perimeter portions, and an interior portion having through holes extending between the first and second surfaces, said apparatus comprising:
a first and second opposed shoulders to support the substrate along portions of the perimeter;
a vacuum chamber defined by four side walls and a printing nest plate, wherein a side wall extends downwardly from a shoulder, and wherein the printing nest plate comprises a plurality of pointed pins constructed and arranged to support the substrate;
a plurality of vacuum holes formed in the printing nest plate; and
a vacuum pump communicating with the vacuum holes.

16. An apparatus as set forth in claim 13 wherein said pointed pins are removably threaded into the printing nest plate.

* * * * *